United States Patent [19]
Lee et al.

[11] Patent Number: 5,917,345
[45] Date of Patent: Jun. 29, 1999

[54] DRIVE SIGNAL GENERATING CIRCUIT FOR SENSE AMPLIFIER

[75] Inventors: Kye Hyung Lee, Seoul; Jin Hong Ahn, Kyungki-Do, both of Rep. of Korea

[73] Assignee: LG Semicon Co., Ltd., Cheongju, Rep. of Korea

[21] Appl. No.: 08/953,555

[22] Filed: Oct. 17, 1997

Related U.S. Application Data

[63] Continuation of application No. 08/581,355, Dec. 28, 1995, Pat. No. 5,777,493.

[30] Foreign Application Priority Data

Dec. 31, 1994 [KR] Rep. of Korea ................. 40472/1994

[51] Int. Cl.[6] ............................. H03K 5/01; G11C 7/00
[52] U.S. Cl. ............................. 327/52; 327/73; 365/207
[58] Field of Search ................................. 327/51–57, 77, 327/87, 88, 89, 563, 72, 73; 365/205, 207, 189.11, 189.07

[56] References Cited

U.S. PATENT DOCUMENTS

| | | | |
|---|---|---|---|
| 4,697,112 | 9/1987 | Ohtani et al. | 327/53 |
| 5,192,878 | 3/1993 | Miyamoto et al. | 327/77 |
| 5,267,203 | 11/1993 | Hwang et al. | 365/190 |
| 5,334,890 | 8/1994 | Hardee | 327/51 |
| 5,544,110 | 8/1996 | Yuh | 327/55 |

OTHER PUBLICATIONS

"Circuit Technique for Optimizing Access Time in Static Random Access Memories", IBM Technical Disclosure Bulletin, vol. 38, No. 5, May 1995, pp. 483–488.

*Primary Examiner*—Timothy P. Callahan
*Assistant Examiner*—Eunja Shin
*Attorney, Agent, or Firm*—Fleshner & Kim

[57] ABSTRACT

A drive signal generating circuit for a sense amplifier compatible with a semiconductor memory device by driving a sense amplifier using both voltage applied from the outside and voltage outputted from a voltage generator. In a conventional circuit, when operating voltage of a sense amplifier is lowered, it is difficult to operate the sense amplifier in high speed as efficiency is lowered. Further, when only using output voltage outputted from the voltage generator, refresh characteristic of the memory cell is lowered because load is great and the sense amplifier is unstably operated in initial sensing state. To overcome the above problems, according to the invention, a drive signal generating circuit for a sense amplifier drives pull-up transistors by using both voltage applied from the outside and voltage outputted from a voltage generator, and enhances the refresh characteristic of the memory cell, thereby preventing decrease of sensing speed, lowering of data restoration level of the memory cell, and lowering of the refresh characteristic appeared when the sense amplifier is driven only by voltage outputted from the voltage generator.

14 Claims, 3 Drawing Sheets

DRIVE SIGNAL GENERATING CIRCUIT FOR SENSE AMPLIFIER

This application is a continuation of application Ser. No. 08/581,355 filed Dec. 28, 1995, now U.S. Pat. No. 5,777,493.

BACKGROUND OF THE INVENTION

1. Field of the Invention

The present invention relates to a drive signal generating circuit for a sense amplifier, and particularly to a drive signal generating circuit for a sense amplifier which is compatible with a semiconductor memory device by driving the sense amplifier using both voltage applied from the outside and voltage outputted from a voltage generator.

2. Description of the Conventional Art

Referring to FIG. 1, there is shown a construction of a conventional semiconductor memory device. The conventional semiconductor memory device includes pull-up transistors PUTo to PUTn each having a gate to which a control signal SPB outputted from a sense amplifier control circuit is applied, and each having a source to which a voltage VCC applied from the outside is applied, respectively; PMOS latches PLo to PLn of the sense amplifier each having one end to which each drain of the pull-up transistors PUTo to PUTn is connected via a pair of bit lines BL and BLB; a memory cell array 10 being connected to word lines WLo to WLm, and connected to the other end of the PMOS latches PLo to PLn of the sense amplifier via the bit lines BL and BLB; NMOS latches NLo to NLn of the sense amplifier each having one end to which the memory cell array 10 is connected via the bit lines BL and BLB; and pull-down transistors PDTo to PDTn each having a drain to which each the other end of the NMOS latches NLo to NLn of the sense amplifier is connected, each having a gate to which a control signal SN outputted from the sense amplifier control circuit is applied, and each having a source to which a ground voltage Vss is applied, respectively.

PMOS latch PLo out of the PMOS latches PLo to PLn of the sense amplifier includes an PMOS transistor 20 having a source to which a drain of the pull-up transistor PUTo is connected via the bit line BLB, and having a drain to which the memory cell array 10 is connected via the bit line BLB; and an PMOS transistor 21 having a gate to which the drain of the NMOS transistor 20 is connected, having a source to which the drain of the pull-up transistor PUTo is connected via the bit line BL, and having a drain to which a gate of the NMOS transistor 20 is connected and further, the memory cell array 10 is connected via the bit line BL. The remaining PMOS latches of the sense amplifier are constructurally the same as the PMOS latch PLo of the sense amplifier.

The memory cell array 10 has a plurality of memory cells which are constructurally the same as the memory cell 11. The memory cell 11 includes an NMOS transistor 12 having a gate to which a word line WLo is connected and having a drain to which the bit line BL is connected; and a capacitor 13 having one end to which a source of the NMOS transistor 12 is connected, and having the other end to which ground voltage is applied.

NMOS latch NLo out of the NMOS latches NLo to NLn of the sense amplifier includes an NMOS transistor 30 having a drain to which the memory cell array 10 is connected via the bit line BLB, and having a source to which the drain of the pull-down transistor PDTo is connected via the bit line BLB; and an NMOS transistor 31 having a drain to which a gate of the NMOS transistor 30 is connected and further the memory cell array 10 is connected via the bit line BL, having a gate to which the drain of the NMOS transistor 30 is connected, and having a source to which the drain of the pull-down transistor PDTo is connected via the bit line BL. The remaining NMOS latches of the sense amplifier are constructurally the same as the NMOS latch NLo of the sense amplifier.

Here, the bit lines BL and BLB are generally precharged with a predetermined voltage VCC/2.

The detailed operation of the conventional semiconductor memory device will be explained.

First, in case of standby state, a control signal SPb of high level is applied to each gate of the pull-up transistors PUTo to PUTn, and a control signal SN of low level is applied to each gate of the pull-down transistors PDTo to PDTn. Accordingly, the pull-up transistors PUTo to PUTn and the pull-down transistors PDTo to PDTn are turned off, and the sense amplifier does not operate.

Whereas, in case of active state, the control signal SPb of low level is applied to each gate of the pull-up transistors PUTo to PUTn, and the control signal SN of high level is applied to each gate of the pull-down transistors PDTo to PDTn. Accordingly, the pull-up transistors PUTo to PUTn and the pulldown transistors PDTo to PDTn are turned on.

When a high level signal is applied to the word line WLo, the cells connected to the word line WLo are selected, and data which are stored in the selected cells are loaded to the bit line BL, thereby the loaded data are latched after being sensed by the PMOS and NMOS latches of the sense amplifier.

That is, when data of high level is stored in the capacitor 13 of the memory cell 11, the stored data of high level is loaded to the bit line BL and the NMOS transistor 30 is turned on, thereby the precharged bit line BLB is charged to low level. As a result, the difference between voltages charged to the bit lines BL and BLB is amplified by NMOS latch NLo. Whereas, when data of low level are stored in the capacitor 13 of the memory cell 11, the difference between voltages charged to the bit lines BL and BLB is amplified by the PMOS latch PLo of the sense amplifier, as shown above.

To reduce electric power of the semiconductor memory device, sensing current having large weight should be lessened, and to lessen the sensing current, voltage level supplied to each source of the pull-up transistors should be lowered.

However, in the conventional semiconductor memory device, when operating voltage of the sense amplifier is lowered, the semiconductor memory device does not operate in high speed because the performance of the sense amplifier is lowered, thereby the sensing speed is decreased.

Further, when voltage outputted from the voltage generator having lower voltage level than voltage applied from the outside is only used, as load in the voltage generator becomes very large, so designing circuits of the voltage generator is not easy. Additionally, as voltage outputted from the voltage generator is unstable in initial sensing state when sensing current amount is great, refresh characteristic of the memory cell is lowered.

SUMMARY OF THE INVENTION

Therefore, it is an object of the present invention to provide a drive signal generating circuit for a sense memory which is compatible with a semiconductor memory device having characteristics of high speed operation and consumption of low electric power, by driving the sense amplifier using both voltage applied from the outside and voltage outputted from a voltage generator.

To achieve the above object, the drive signal generating circuit for the sense amplifier according to the present invention includes an inverter for inverting control signal outputted from a sense amplifier control circuit; a NOR gate having one end to which the control signal is applied, and having the other end to which signal of a first node is applied; a first PMOS transistor having a gate to which the signal of the first node is applied, and having a source to which voltage applied from the outside is applied, respectively; a second PMOS transistor having a source to which a drain of the first PMOS transistor is connected, and having a gate to which signal outputted from the inverter is applied; a third PMOS transistor having a source to which the source of the second PMOS transistor is connected, having a drain to which a drain of the second PMOS transistor is connected, and having a gate to which the drain of the second PMOS transistor is connected via the second node; a first NMOS transistor having a drain to which the second node is connected, and having a gate to which voltage outputted from the voltage generator is applied; a second NMOS transistor having a drain to which a source of the first NMOS transistor is connected, having a gate to which the signal outputted from the inverter is applied, and having a source to which ground voltage Vss is applied; a fourth PMOS transistor having a source to which the drain of the first PMOS transistor is connected, and having a gate to which the gate of the third PMOS transistor is connected; a fifth PMOS transistor having a source to which the source of the fourth PMOS transistor is connected, having a drain to which a drain of the fourth PMOS transistor is connected, and having a gate to which the signal outputted from the inverter is applied; a third NMOS transistor having a drain to which each drain of the fourth and fifth PMOS transistors is connected via the first node, having a gate to which signal inputted to each source of the PMOS latches of the sense amplifier is applied, and having a source to which the drain of the second NMOS transistor is connected; and a NAND gate having one end to which the signal of the first node is applied, and having the other end to which the signal outputted from the inverter is applied.

BRIEF DESCRIPTION OF THE DRAWINGS

The above object and advantages of the present invention will be more clearly understood from the following detailed description taken in conjunction with the accompanying drawings, in which.

DETAILED DESCRIPTION OF THE PREFERRED EMBODIMENTS

Figure 1:
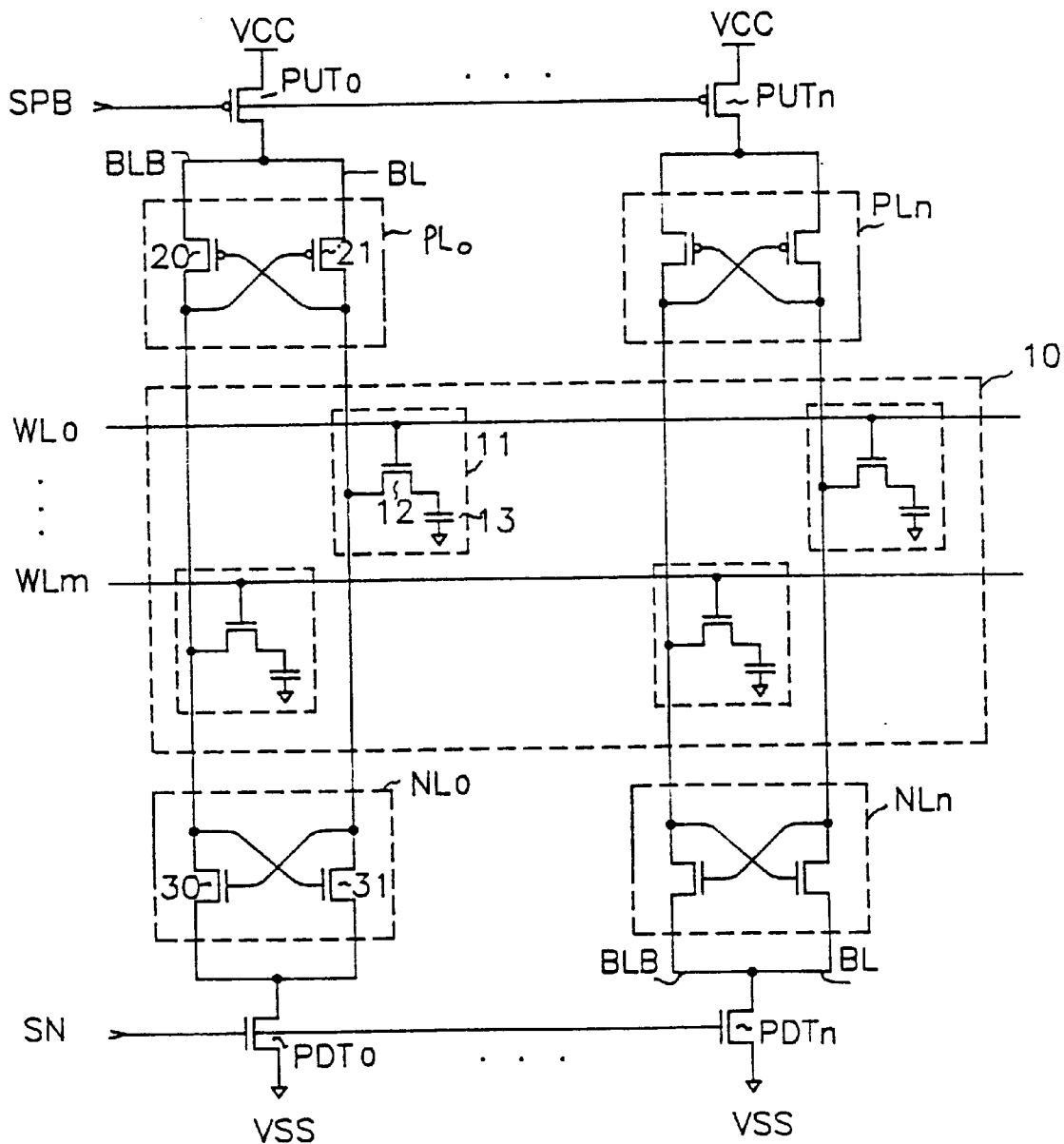
FIG. 1 is a block diagram of a conventional semiconductor memory device.

The drive signal generating circuit for a sense amplifier according to the present invention will be described, with reference to the drawings.

Here, a first node corresponds to a node N1, and a second node a node N2, respectively. Similarly, first to fifth PMOS transistors correspond to PMOS transistors 42, 43, 44, 47 and 48, and first to third NMOS transistors correspond to NMOS transistors 45, 46 and 49, respectively.

The drive signal generating circuit for a sense amplifier includes an inverter 40 for inverting a control signal SPb outputted from a sense amplifier control circuit; a NOR gate 41 having one end to which the control signal SPb is applied, and having the other end to which signal of the node N1 is applied; a PMOS transistor 42 having a gate to which the signal outputted from a NOR gate 41 is applied, and having a source to which a voltage VCC supplied from the outside is applied; a PMOS transistor 43 having a source to which a drain of the PMOS transistor 42 is connected, and having a gate to which the output signal of the inverter 40 is applied; a PMOS transistor 44 having a source to which the source of the PMOS transistor 43 is connected, having a drain to which a drain of the PMOS transistor 43 is connected, and having a gate to which the drain of the PMOS transistor 43 is connected via a node N2; an NMOS transistor 45 having a drain to which the node N2 is connected, and having a gate to which a voltage VDD outputted from a voltage generator is applied; an NMOS transistor 46 having a drain to which a source of the NNIOS transistor 45 is connected, having a gate to which the signal outputted from the inverter 40 is applied, and having a source to which the ground voltage Vss is applied; a PMOS transistor 47 having a source to which the drain of the PMOS transistor 42 is connected, and having a gate to which the gate of the PMOS transistor 44 is connected; a PMOS transistor 48 having a source to which the source of the PMOS transistor 47 is connected, having a drain to which a drain of the PMOS transistor 47 is connected, and having a gate to which the signal outputted from the inverter is applied; an NNIOS transistor 49 having a drain to which each drain of the PMOS transistors 47 and 48 is connected via the node N1, and having a source to which the drain of the NMOS transistor 46 is connected; and a NAND gate 50 having one end to which the signal of the node N1 is applied, and having the other end to which the signal outputted from the inverter 40 is applied.

Here, the voltage VDD outputted from the voltage generator has lower voltage than the voltage VCC applied from the outside.

Figure 3:
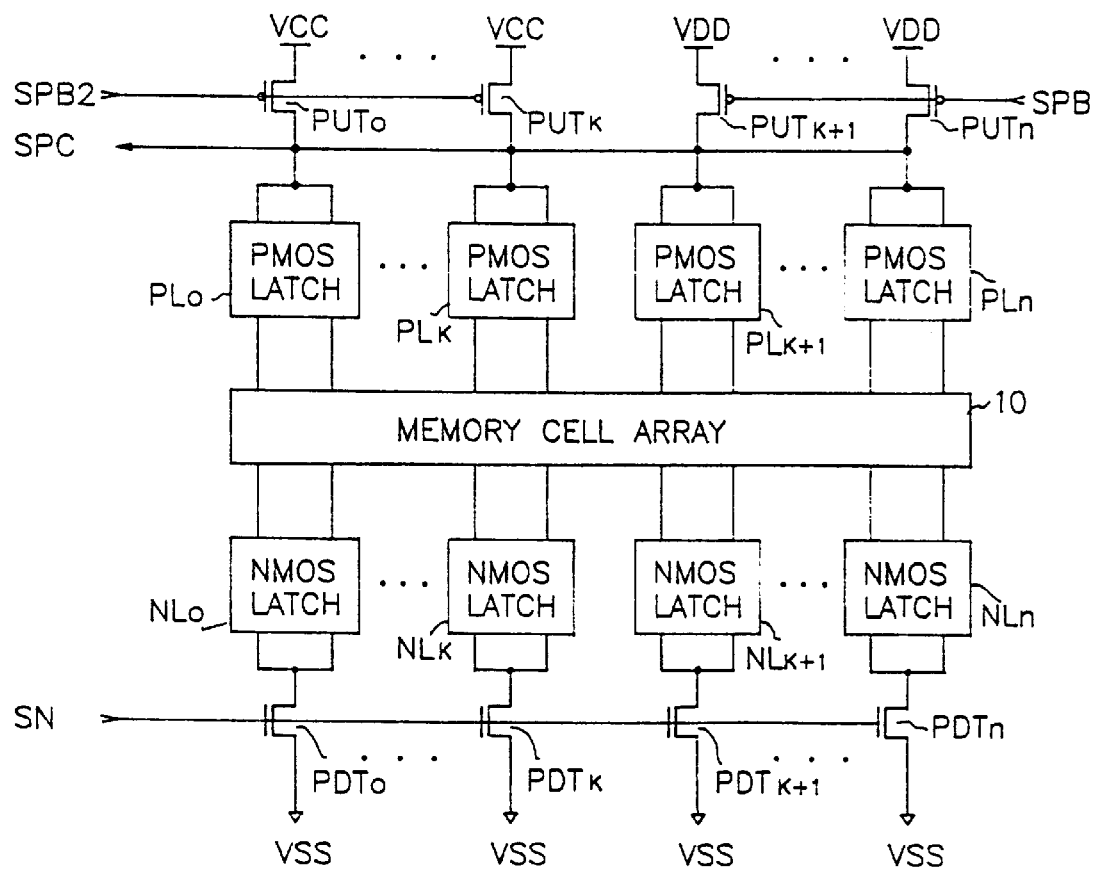
FIG. 3 is a block diagram of a semiconductor memory device according to the present invention.

Referring to FIG. 3, the semiconductor memory device in accordance with the present invention includes pull-up transistors $PUT_0$ to $PUT_n$; PMOS latches $PL_0$ to $PL_n$ of the sense amplifier; a memory cell array 10; NMOS latches $NL_0$ to $NL_n$ of the sense amplifier; and pull-down transistors $PDT_0$ to $PDT_n$.

Pull-up transistors $PUT_0$ to $PUT_k$ out of the pull-up transistors $PUT_0$ to $PUT_n$ each have a gate to which a control signal SPb2 outputted from the drive signal generating circuit of the sense amplifier is applied, and pull-up transistors $PUT_{k+1}$ to $PUT_n$ each have a source to which the voltage VDD outputted from the voltage generator is applied and have a gate to which control signal SPb outputted from the sense amplifier control circuit is applied. Further, signal SPC supplied to each source of the PMOS latches $PL_0$ to $PL_n$ of the sense amplifier is applied to a gate of the NMOS transistor 49 included in the drive signal generating circuit for the sense amplifier. PMOS latches $PL_k$ and $PL_{k+1}$ are respectively connected to NMOS latches $NL_k$ and $NL_{k+1}$ of the sense amplifier via the memory cell array 10.

Figure 2:
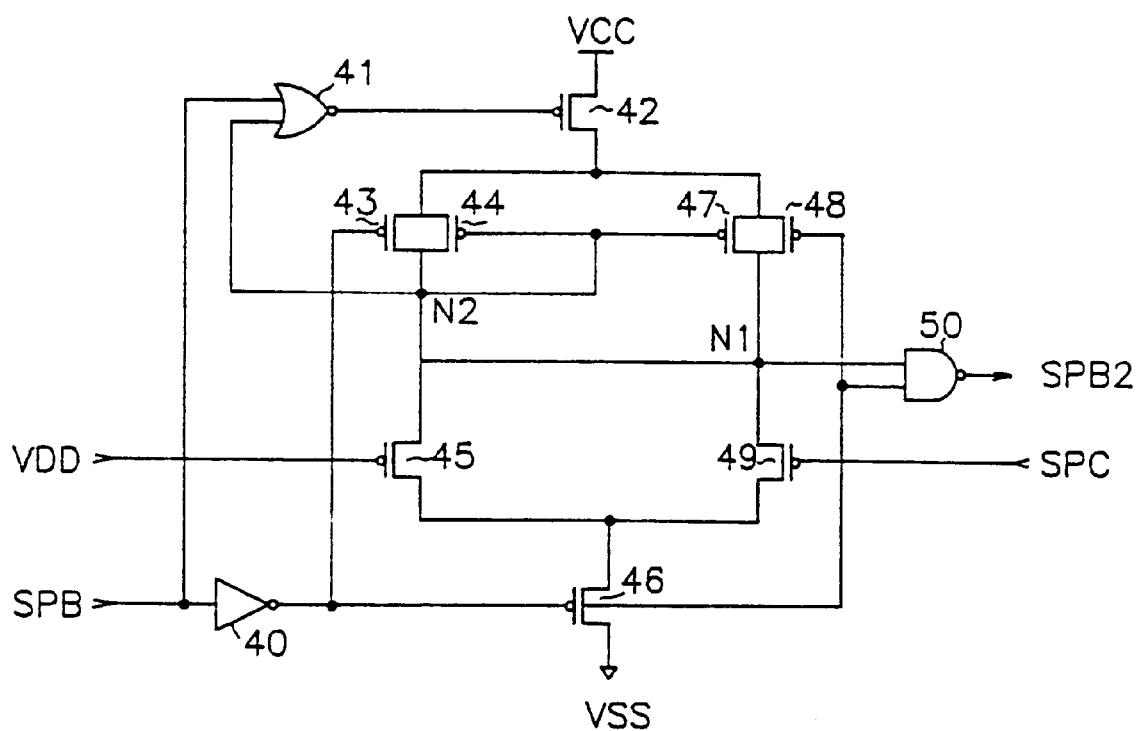
FIG. 2 is a block diagram of a drive signal generating circuit for a sense amplifier according to the present invention.

The detailed operations will be explained with reference to FIGS. 2 and 3.

First, when in standby state, the control signal SPb of high level is respectively applied to the inverter 40, the NOR gate 41, and each gate of the pull-up transistors $PUT_{k+1}$ to $PUT_n$, while the control signal SN of low level is applied to each gate of the pull-down transistors $PDT_0$ to $PDT_n$. Next, the NOR gate 41 outputs a low level signal and the PMOS transistor 42 is turned on. The PMOS transistors 43 and 48 are turned on by low level signal outputted from the inverter 40, and the NMOS transistor 46 is turned off. And then, the nodes N2 and N1 are charged to high level, and the PMOS transistors 44 and 47 are turned off.

Accordingly, the NAND gate 50 outputs control signal SPb2 of high level, and the pull-up transistors PUTo to PUTk are turned off. The pull-up transistors $PUT_{k+1}$ to PUTn are turned off by the control signal SPb of high level, and the pull-down transistors PDTo to PDTn are turned off by the control signal SN of low level, respectively, thereby the sense amplifier does not operate.

On the other hand, when in active state, the control signal SPb of low level is respectively applied to the inverter 40, the NOR gate 41 and each gate of the pull-up transistors $PUT_{k+1}$ to PUTn, while, the control signal SN of high level is applied to each gate of the pull-down transistors PDTo to PDTn.

Next, after the inverter 40 outputs high level signal, the PMOS transistors 43 and 48 are turned off, and the NMOS transistor 46 is turned on. In initial sensing state when level of the signal SPC applied to a gate of the NMOS transistor 49 is lower than level of the voltage VDD applied to a gate of the NMOS transistor 45, as the node N2 has electric potential of low level, the PMOS transistors 44 and 47 are turned on. Whereas, the node N1 has electric potential of high level, the NOR gate 41 outputs low level signal, thereby the PMOS transistor 42 is turned on.

Accordingly, current caused by the voltage VCC applied from the outside passes successively the PMOS transistors 42 and 44 and NMOS transistors 45 and 46.

The NAND gate 50 receives electric potential of high level from the node N1 and receives high level signal outputted from the inverter 40, thereby outputting control signal SPb2 of low level.

As a result, the pull-up transistors $PUT_{k+1}$ to PUTn are turned on by the control signal SPb of low level, the pull-up transistors PUTo to PUTk are turned on by the control signal SPb2 of low level, and the pull-down transistors PDTo to PDTn are turned on by the control signal SN of high level, respectively.

When the level of the signal SPC is higher than the level of the voltage VDD, the PMOS transistors 44 and 47 are turned off because the node N2 has electric potential of high level. Whereas, as the node N1 has electric potential of low level, the NOR gate 41 outputs high level voltage, and the PMOS transistor 42 is turned off.

Accordingly, current path by the voltage VCC applied from the outside is blocked and current by the voltage VCC applied from the outside is no longer exhausted.

Meanwhile, the NAND gate 50 receives electric potential of low level from the node N1 and receives high level signal outputted from the inverter 40, and outputs the control signal SPb2 of high level, thereby the pull-up transistors PUTo to PUTk are turned off.

That is, until the control signal SPb is transited to high level from low level, the NMOS transistors 49 and 46 are turned on, and electric potential of low level is maintained in the node N1. And the control signal SPb2 outputted from the NAND gate 50 is maintained to high level.

In result, in initial sensing state, the pull-up transistors PUTo to PUTn are all turned on, and the sense amplifier is driven. Continuously, the pull-up transistors PUTo to PUTk are turned off and the pull-up transistors $PUT_{k+1}$ to PUTn are turned on, thereby the sense amplifier is driven.

Thereafter, when the control signal SPb is transited to high level, standby state is restored.

As described above, current is supplied by the voltage applied from the outside and supplied by the output voltage from the voltage generator in initial sensing state when sensing current amount is great, and continuously the sense amplifier is driven only by output voltage of the voltage generator.

Accordingly, according to the present invention, as load in the voltage generator is noticeably lessened, voltage outputted from the voltage generator is stably generated in sensing state, and designing the voltage generator becomes very easy, thereby preventing decrease of sensing speed, lowering of data restoration level of the memory cell, and lowering of refresh characteristic appeared when the sense amplifier is driven only by voltage outputted from the voltage generator.

Further, the present invention has a benefit to reduce electric consumption in comparison with the conventional circuit in which the sense amplifier is driven only by the voltage applied from the outside.

What is claimed is:

1. A semiconductor device, comprising:
    an array of memory cells arranged in rows and columns and coupled to a plurality of wordlines and bitlines;
    a circuit that reads and writes data into said array of memory cells including a sense amplifier having
        a plurality of latches coupled to said plurality of bitlines, wherein first, second and third groups of latches form the pluarality of latches,
        a first plurality of transistors, each having a first electrode coupled to a corresponding latch of the first group of the plurality of latches, a second electrode coupled for receiving a first prescribed voltage and a first control electrode coupled for receiving a first control signal, and
        a second plurality of transistors, each having a first electrode coupled to a corresponding latch of the second group of the plurality of latches, a second electrode coupled for receiving a second prescribed voltage and a second control electrode coupled for receiving a second control signal, and
        a third plurality of transistors, each having a first electrode coupled to a corresponding latch of the third group of the plurality of latches, a second electrode coupled for receiving a third prescribed voltage and a third control electrode coupled for receiving a third control signal; and
    a drive signal generating circuit coupled for receiving the third control signal and said third prescribed voltage and coupled to the first electrodes of said second and third plurality of transistors, wherein said drive signal generating circuit generates the second control signal that enables said second plurality of transistors.

2. The semiconductor device of claim 1, wherein said first plurality of transistors are pull-down transistors, and said second and third plurality of transistors are pull-up transistors, the first and second prescribed voltages being ground and source voltages, respectively.

3. The semiconductor device of claim 1, wherein the third prescribed voltage has a magnitude between the first and second prescribed voltages.

4. The semiconductor device of claim 1, wherein the first electrodes of said second and third plurality of transistors are commonly coupled to provide a drive control signal to said drive signal generating circuit.

5. The semiconductor device of claim 4, wherein said drive signal generating circuit comprises:

an enabling circuit for generating the second control signal that enables said second plurality of transistors when said drive control signal is less than the third prescribed voltage and a disables said second plurality of transistors when said drive control signal is greater than the third prescribed voltage.

6. The semiconductor device of claim 4, wherein said drive signal generating circuit comprises:

a) first and second logic gates, each having an input coupled for receiving the third control signal;

b) first, second, third, fourth and fifth transistors of a first conductivity type, each having first and second electrodes and a control electrode, wherein i) the first electrode of said first transistor is coupled for receiving the second prescribed voltage, the control electrode of said first transistor is coupled to an output of said first logic gate and the second electrode of said first transistor is coupled to the first electrodes of said second, third, fourth and fifth transistors, ii) the control electrodes of said third and fourth transistors and the second electrode of said second and third transistors are commonly coupled to each other, and the second electrodes of the fourth and fifth transistors are commonly coupled to each other and are coupled to another input of said first logic gate, and iii) control electrodes of said second and fifth transistors are coupled for receiving an output of said second logic gate;

c) first, second and third transistors of a second conductivity type, each having first and second electrodes and a control electrode, wherein i) the first electrode of said first transistor of the second conductivity type is coupled to the second electrodes of said second and third transistors of the first conductivity type, the control electrode of said first transistor of the second conductivity type is coupled for receiving the third prescribed voltage, ii) the first electrode of said second transistor of the second conductivity type is coupled to the second electrodes of said fourth and fifth transistors of the first conductivity type and the control electrode of said second transistor is coupled for receiving the drive control signal, and iii) the first electrode of said third transistor of the second conductivity type is coupled to the second electrodes of said first and second transistors of the second conductivity type, the control electrode being coupled for receiving the output of the second logic gate and the second electrode coupled to the first prescribed voltage; and d) a third logic gate having a first input coupled for receiving the output of the second logic gate, and a second input coupled to the first electrode of said second transistor of the second conductivity type to generate the second control signal.

7. The semiconductor device of claim 6, wherein said first plurality of transistors are pull-down transistors, and said second and third plurality of transistors are pull-up transistors, the first and second prescribed voltages being ground and source voltages, respectively.

8. The semiconductor device of claim 6, wherein the third prescribed voltage has a magnitude between the first and second prescribed voltages.

9. The semiconductor device of claim 6, wherein said first, second, third, fourth and fifth transistors of the first conductivity type are PMOS transistors.

10. The semiconductor device of claim 6, wherein said first, second and third transistors of the second conductivity type are NMOS transistors.

11. The semiconductor device of claim 6, wherein said first, second and third logic gates are a NOR gate, an inverter and a NAND gate, respectively.

12. A semiconductor device, comprising:

an array of memory cells arranged in rows and columns and coupled to a plurality of wordlines and bitlines;

a circuit that reads and writes data into said array of memory cells including a sense amplifier having a plurality of latches coupled to said plurality of bitlines, wherein first, second, and third groups of latches form the plurality of latches a first plurality of transistors, each having a first electrode coupled to a corresponding latch of the first group of the plurality of latches, a second electrode coupled for receiving a first prescribed voltage and a first control electrode coupled for receiving a first control signal, and a second plurality of transistors, each having a first electrode coupled to a corresponding latch of the second group of the plurality of latches, a second electrode coupled for receiving a second prescribed voltage and a second control electrode coupled for receiving a second control signal, and a third plurality of transistors, each having a first electrode coupled to a corresponding latch of the third group of the plurality of latches, a second electrode coupled for receiving a third prescribed voltage and a third control electrode coupled for receiving a third control signal; and a drive signal generating circuit coupled for receiving the third control signal and said third prescribed voltage and coupled to the first electrodes of said second and third plurality of transistors for receiving a drive control signal, wherein said drive signal generating circuit generates the second control signal that enables said second plurality of transistors, wherein the drive signal generating circuit drives the sense amplifier using one of a first voltage level and a second voltage level, wherein the first voltage level is greater than the second voltage level.

13. The semiconductor device of claim 12, wherein said first voltage level includes the second and third prescribed voltages, and wherein the second voltage level is the first prescribed voltage.

14. The semiconductor device of claim 12, wherein said drive signal generating circuit comprises:

an enabling circuit for generating the second control signal that enables said second plurality of transistors when said drive control signal is less than the third prescribed voltage and disables said second plurality of transistors when said drive control signal is greater than the third prescribed voltage.

* * * * *